Nov. 13, 1962 J. A. HOERNI 3,064,167

SEMICONDUCTOR DEVICE

Original Filed May 1, 1959

INVENTOR.
JEAN A. HOERNI

BY

Lippincott, Ralls & Hendricson
ATTORNEYS

United States Patent Office 3,064,167

Patented Nov. 13, 1962

3,064,167
SEMICONDUCTOR DEVICE

Jean A. Hoerni, Los Altos, Calif., assignor, by mesne assignments, to Fairchild Camera and Instrument Corporation, Syosset, N.Y., a corporation of Delaware Original application May 1, 1959, Ser. No. 810,388. Divided and this application May 19, 1960, Ser. No. 30,256

6 Claims. (Cl. 317—234)

Figure 2:
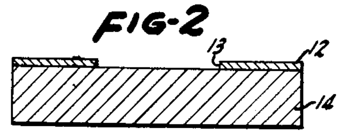

This application is a division of my copending application Serial No. 810,388, filed May 1, 1959, and now Patent No. 3,025,589.

The present invention relates to an improvement in semiconductor devices including transistors and to an improved transistor structure. More particularly, the invention relates to an improved diffusion transistor having fully protected junctions and maximized exposed surfaces for ohmic contact attachment.

Advancements in transistor technology have in part been directed to the production of very small sized transistor structures, inasmuch as minute semiconductor geometries are required for high frequency applications of transistors. While the well known point-contact transistor is adapted for high frequency work, yet certain limitations attach to this type of transistor and consequently junction transistors have been developed for use in the high frequency range. One type of junction transistor which is particularly well adapted for high frequency applications is the double-diffused silicon transistor, and although the present invention is adapted for use with other types of transistors it is with respect to double-diffused silicon transistors that the following description is referenced.

As regards the manufacture of double-diffused silicon transistors, and in fact any minute transistor structure, difficulty is encountered in providing a sufficient exposed area of the base material for attachment of an ohmic contact thereto. By maintaining the extremely small element dimensions required of the transistor, there results only a minute thickness of base material exposed between the base-collector junction and the emitter-base junction on a transistor surface. Conventional transistor utility requires the provision of electrical contacts to the individual transistor elements or portions, and thus it is necessary for the dimensions of the base portion to be made sufficient to attach such contacts. In certain instances this limitation upon the size of the base portion is highly undesirable, inasmuch as conventional manufacturing practices produce a base thickness in proportion to the exposed base width.

Another difficulty arising from the limited size necessary for transistors to suitably operate at very high frequencies is encountered in the difficulty of protecting the transistor junction. This is particularly noted in the attachment of electrical contacts to the transistor portions inasmuch as very minute variations in the placement of electrical conductors or ohmic contacts to the transistor may well result in electrically shorting of the transistor junction, whereby the transistor structure is unsuited for use and must be rejected. This latter problem is compounded by the necessity in high-frequency transistors of employing an ohmic contact which substantially entirely covers the exposed surface of each of the elements in order to minimize the spreading resistance thereof. Conventional plating methods are unsuited for the provision of such ohmic contacts to within fractions of a millimeter from the transistor junction, as is normally required for transistor structures capable of operating at very high frequencies. Not only is the problem of providing suitable ohmic contacts to the transistor portions a major one, but also the possible damage or other types of inadvertent electrical shorting of the transistor junctions during manufacturing processes is of major importance in limiting the number of rejects in any manufacturing process. Additionally, long range contamination of transistor junctions may be a cause of drifting and deterioration of transistor characteristics.

There have been developed for high frequency applications transistors of the "mesa" design wherein undesirable lateral extensions of the base-collector junction are removed by etching to produce transistors of very small dimensions. Although mesa transistors have found wide acceptance in the art, the junction exposed by the etching, as well as the other junction, is particularly vulnerable to contamination or degradation during subsequent portions of the manufacturing process. In accordance with the present invention there is produced a transistor having the minute dimensions of the mesa type, but with the transistor junctions at all times fully protected by an oxide layer or coating formed simultaneously with the junction during diffusion at high temperatures so that no contamination of the transistor junctions during or after manufacture is possible. In this manner, one of the major causes of transistor failure is entirely precluded.

It is an object of the present invention to provide an improved semiconducting device having a protective coating thereover except for ohmic contact areas.

It is a still further object of the present invention to provide an improved transistor structure having a laterally extended base surface for ohmic contact thereto, and including covered junction and exposed transistor surfaces.

Various other possible objects and advantages of the present invention will become apparent to those skilled in the art from the following description of the present invention. Although the invention is herein illustrated with respect to particular preferred embodiments thereof, no limitation is intended thereby, and reference is made to the appended claims for a precise delineation of the true scope of the present invention.

The present invention is particularly well adapted to diode units as well as multi-element units. Although the problems encountered in high frequency triode transistors are normally more troublesome than those found in the diode art, yet the present invention provides material advantage diode semiconductors. Furthermore, although as previously noted, the present invention may be employed with a variety of semiconducting materials, yet actual use thereof has been primarily directed to silicon transistors and thus the following description is referenced thereto.

Figure 1:
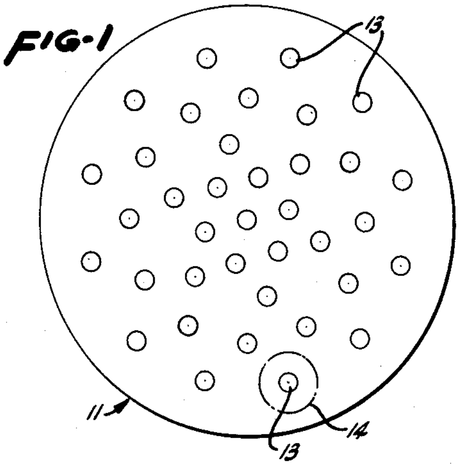
Figure 3:
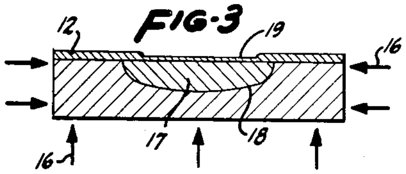
Figure 4:
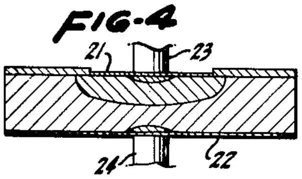
Figure 5:
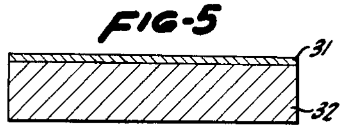
Figure 9:
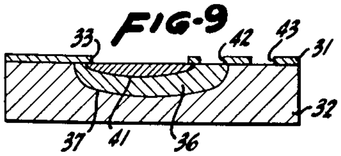
Figure 10:
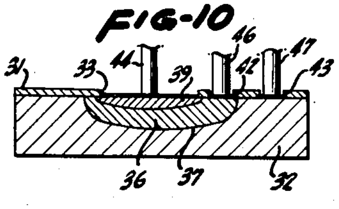

The invention is illustrated in the accompanying drawings wherein:

FIG. 1 is a plan view of a wafer of semiconducting material having the masking layer thereof removed within the illustrated circles;

FIGS. 2, 3, and 4 are sectional views through a semiconducting diode device, at separate stages of manufacture thereof, in accordance with the present invention;

FIGS. 5, 6, 7, 8 and 9 are sectional views through a triode semiconducting device or transistor, showing same at separate stages of manufacture, in accordance with the present invention; and FIG. 10 is a sectional view through a transistor in accordance with the present invention.

Reference is made to FIGS. 1 to 4, wherein there is illustrated a diode semiconducting device, at various stages of manufacture thereof, in accordance with the present invention. There is illustrated in FIG. 1 a wafer 11 formed of a semiconducting material such as silicon having, for example, an N-type impurity therein. This wafer 11 has formed thereon as a step of the present invention, a coating 12 entirely covering the upper surface of the wafer. Preferably, this coating is formed of a silicon oxide, and various methods of producing such a layer are known in the art, as, for example, by exposure of the silicon wafer to moisture and air, or by the utilization of an oxidizing agent such as hydrogen peroxide or the like. The oxide coating or layer 12 is formed into a mask by the production of a plurality of openings therethrough, and these openings are herein denominated by the numeral 13. The removal of the oxide layer within the illustrated circles or openings 13 may be accomplished by photoresist techniques or by etching, as, for example, with hydrofluoric acid. Following the production of a masked wafer as illustrated in FIG. 1, the wafer may be cut into segments to form individual portions of separate diodes, although an alternative procedure is to form the diodes in a plurality upon the wafer 11 with a subsequent division of the wafer into separate diode units.

As herein illustrated, there is shown in FIG. 2 an individual minute wafer 14 cut from the large wafer 11, and having a mask 12 thereon, with a central aperture 13 therethrough exposing the upper surface of the wafer thereat. As a further step in the manufacture of the semiconductor diode, there is provided an impurity upon the upper surface of the wafer 14 within the aperture 13. With an N-type silicon wafer, the impurity would be one of the known acceptor impurities preferably alloyed with silicon, and heat is added to the wafer and impurity, as indicated by the arrow 16. Application of sufficient heat to raise the wafer to an appropriate temperature results in a diffusion of the impurity applied into the wafer 14, so as to produce a region or portion 17 of P-type silicon within the wafer. Intermediate these two types of silicons now forming the wafer 14, there is produced a junction 18 in the well known manner whereat particular desired electrical characteristics are realized. During the diffusion of the impurities into the wafer of silicon 14, there is normally produced an oxidation of surface silicon so that, as indicated in FIG. 3, an oxide layer completely covers the top thereof.

In accordance with the present invention, the added oxide layer 19 within the masking aperture 13 is then removed as by etching with hydrofluoric acid or other suitable means so as to expose the upper surface of the P-type silicon material 17 with the juncture between same and the N-type silicon being yet covered by the original masking layer 12. The diode device may then be completed by providing an ohmic contact 21 to the upper surface of the wafer within the aperture 13 and a similar contact 22 upon the underside of the wafer. These ohmic contacts may be conveniently applied by well known plating methods to deposit such as gold or the like upon the silicon, and electrical contacts or wires 23 and 24 are then attached to the device by alloying same to the ohmic contacts 21 and 22 and to the connecting silicon 17 at the top and 14 at the bottom. This alloying step is accomplished at a temperature in excess of the gold-silicon eutectic temperature of 373 degrees C., and serves the purpose of reducing electrical discontinuities at the connection. During the manufacture of the diode semiconducting device described above, the oxide layer formed upon the silicon is retained thereon at all times except at the surfaces to be employed in connection with ohmic contacts to the device. The resultant diode structure will be seen to be fully protected, particularly at the PN junction thereof, so as to prevent contamination and possible electrical leakage resulting from handling of the device and cleaning and canning of same during fabricating steps of the diode. It is of particular note that only within the original masking opening 13 is the oxide layer removed during the diode manufacture, and at all other parts of the device there is provided an integral protective layer of silicon oxide.

Figure 6:
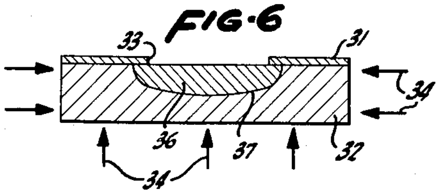
Figure 8:
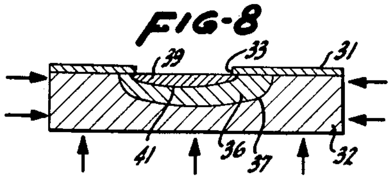

Considering now the present invention as same relates to double-diffused silicon transistors, reference is made to FIGS. 5 to 9 of the drawings. As a first step in the manufacture there is produced a layer 31 formed, for example, of an oxide of silicon, and covering at least the upper surface of a silicon wafer 32, which may be formed of N-type silicon, for example. There is provided in this oxide layer 31 a hole or opening 33 which may be formed by photoresist techniques or by etching of the layer, and the configuration of the opening in the layer 31 is controlled to define the desired configuration of the transistor base member. The apertured layer 31 serves as a mask for protecting the transistor surface and junctions, and for limiting the lateral diffusion of impurities in the wafer. The layer is thus formed of a material into which impurities to be employed during transistor manufacture will not diffuse during the steps thereof, and which not only tightly adheres to the wafer surface in protective relation thereto, but which also is not electrically conducting. Upon the upper surface of the wafer 32 exposed at the aperture 33 in the mask or layer 31, there is disposed a predetermined amount of acceptor impurity, as in the form of a silicon alloy, and heat is applied, as indicated by the arrows 34, whereby the impurity diffuses into the wafer 32 to form a P-type base layer 36 therein. In conventional manner there is produced through controlled heating and cooling of the transistor structure, a transistor junction 37 between the base layer 36 and the wafer 32 with the upper terminus of this junction lying beneath the oxide mask 31, as illustrated in FIG. 6. As silicon technology is available in the literature, it is here only noted that N-type silicon may be formed by inclusion of an impurity chosen from group V of the periodic table, while P-type silicon may be formed by inclusion of an impurity from group III.

Figure 7:
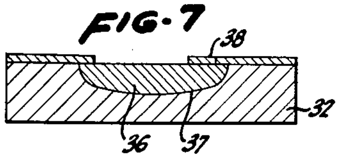

During or following disposition of the base layer 36 upon the wafer 32 and the formation of a transistor junction 37 therebetween, there is formed an additional or extensional portion of the oxide layer 31, as shown at 38 of FIG. 7. This additional masking 38 extends the oxide coating over an additional part of the base layer 36 to the end of masking same so that the second layer of material to be diffused into the transistor will not extend to both extremities of the base layer. With the augmented masking layer 31 upon the upper surface of the wafer 32 and in masking relation to some substantial portion of the base layer 36, there is diffused into the transistor structure a second layer 39 by the provision of a suitable impurity or alloy thereof atop the base layer and the addition of heat to raise the wafer and impurity upon same to diffusion temperature. In a conventional manner the diffusion of impurities into the wafer is precisely controlled as to rapidity and extent, so that there is thereby formed a second transistor junction 41 between an emitter layer 39 and the base layer 36. As may be seen from FIG. 8 of the drawings, the emitter 39 diffuses into the base and the junction 41 therebetween terminates at the upper surface of the wafer beneath the mask 38 adjacent the opening of reduced size therein. It will be further appreciated from the structure illustrated in FIG. 8 that there then results an uneven disposition of the second diffused layer 39 in that the same is offset from the center of the base layer 36. Particular advantage is derived from this relationship of the respective layers for, as illustrated in FIG. 9, there is then removed a portion of the masking layer 31 to form an opening 42 therethrough immediately above the portion of the base layer 36 extending laterally from the emitter 39. In this manner, there is provided a substantial contact area of the base layer 36 available at the upper surface of the transistor for attachment of an ohmic contact thereto. Please note in this respect that the mask 31 is not removed from the upper surface of the transistor above the emitter-base junction 41, but instead is retained thereat so as to protect this junction from inadvertent shorting or other damage during subsequent manufacturing and handling operations. Not only is this junction 41 covered at the above-noted points, but additionally it is wholly encased by the oxide layer 31 at all other points upon the upper surface of the wafer. Likewise, the base-collector junction 37 is fully covered by the oxide layer 31 atop the transistor. As a consequence of this structure, there is provided a materially improved transistor structure wherein inadvertent damage or shorting of the junctions thereof is wholly precluded. In a conventional manner there may then be applied omhic contacts to the emitter, base and collector. In this respect it is herein possible to provide an ohmic contact to the collector at the upper surface thereof so as to produce a transistor having all contacts on the same side. This is herein accomplished by providing an additional opening through the mask 31 in lateral separation from the base opening 42 and therefore unmasking a desired extent of the collector at the top thereof. Ohmic contacts 44, 46 and 47 are then applied in a relatively conventional manner to the separate portions of the transistor through the openings 33, 42 and 43. It is herein possible to employ conventional plating techniques to apply electrical conductors to the semiconductor. Inasmuch as the transistor junctions are entirely covered and protected upon the upper surface of the transistor, no possible electrical shorting or damage to junctions can result from the plating or alloying processes employed.

It will of course be appreciated that the silicon oxide herein stated as comprising the masking layer 31 upon the transistor wafer 32 does not react with the impurity employed in the formation of different type semi-conducting materials. In this respect, particular care must be taken to exclude gallium as a suitable impurity from the group III elements that may be diffused into the silicon, for this particular element does diffuse through silicon oxide and consequently the mask will not be effective to limit the lateral extent of the diffusion of the impurity. Substantially all of the impurities which are desirable for use as dopants or diffusing elements with silicon do not readily diffuse through the oxide layer herein employed, and consequently the method of the present invention is only limited insofar as the element gallium is concerned.

It is further noted that in the process above described relating to the manufacture of a triode transistor of a double-diffused silicon type, any unavoidable production of an oxide layer upon the upper surface of the wafer at points wherein the same is not desired is followed by the removal of same. Thus, for example, following the production of the base layer 36 by diffusing the selected impurity into the wafer 32, there may result a thin oxide layer over the top of the base portion of the transistor and this layer is then removed, at least in part, as by etching or photoresist techniques.

Considering now the improved double-diffused silicon transistor of the present invention, reference is made to FIG. 10 of the drawing, where there is illustrated in cross-section such a transistor. As may be seen from this figure, the improved transistor includes a collector disc or wafer 32, formed for example, of an N-type silicon. At the top of this collector wafer 32 there is disposed a thin base layer 36, formed of silicon of opposite conductive type, thus in the present example of P-type silicon. Atop the base layer 36 there is provided an emitter layer or dot 39, of N-type silicon, and having a very minute dimension. Although not previously discussed, the present invention is particularly adapted to high frequency applications wherein very small dimensions are required of the transistor portions. Thus, in the present invention, the lateral extent of the emitter may be substantially less than one millimeter and the thickness of the base layer between emitter and collector may be of the order of one micron. Upon the upper surface of the wafer 32 there is provided the oxide layer or coating 31 which will be seen to fully cover both the emitter-base junction 41 and the base-collector junction 37. Openings 33, 42 and 43 through this oxide coating 31 provide communication with the emitter, base and collector, respectively, of the transistor whereby ohmic contacts may be made all in the upper plane of the transistor. Thus an ohmic contact including an electrical lead 44 is provided atop the emitter 39, while a second ohmic contact including a lead 46 is provided in connection with the upper surface of the base 36 through the masked openings 42. Likewise, a third ohmic contact 47 including an electrical conductor, is electrically and mechanically joined to the upper surface of the collector wafer 32 through the mask opening 43. The resulting transistor structure illustrated in FIG. 10 of the drawing will be seen to be particularly well adapted for high frequency applications, and furthermore, to be fully protected from shorting of the junctions thereof as may otherwise occur during manufacture. While this transistor structure is well adapted to the provision of an ohmic contact to the collector thereof at the common upper surface of the transistor, yet the collector contact may also be provided upon the under surface of the wafer 32 as in the manner of the diode manufacture described above.

Although the above description of both the manufacturing process and the transistor structure has been referenced to an NPN transistor, it will be appreciated that it is equally applicable to PNP type transistors.

What is claimed is:

1. An improved double-diffused transistor structure comprising a thin wafer having a plane upper surface, said wafer being mostly of a first conductive type of semiconductor, a first thin layer of opposite conductive type semiconductor diffused into only part of the upper surface of said wafer, a second layer of first conductive type semiconductor diffused into only part of the upper surface of said first layer closer to one edge thereof than to the other so that a substantial area of said first layer appears at the upper surface of the wafer, a protective adherent non-conducting coating upon the upper surface of the wafer and having openings therethrough to said second layer and wafer, as well as to said first layer only at the substantial surface area of the latter, and electrical leads extending through said openings into contact with said wafer and first and second layers at the upper surface of said wafer.

2. An improved transistor structure comprising a thin wafer of semiconducting material having a planar upper surface, a first zone extending into said wafer from said planar surface and defining a transistor junction between same and the remainder of said wafer with such junction extending to said planar surface about said zone, a second zone extending into said wafer from said surface within said first zone and defining with the latter a second transistor junction which likewise extends to the planar surface of said wafer, an integral insulating coating upon at least the planar surface of said wafer in totally covering relation to all transistor junctions thereat, and electrical conductors extending through openings in said coating into ohmic contact with separate zones of the transistor at the planar surface thereof.

3. A transistor comprising a semiconductor body having a plane surface, said semiconductor body containing a diffused base layer extending into the body from such plane surface, the base layer being of smaller lateral extent than the plane surface and having a boundary defining a collector junction extending to such plane surface and there surrounding the base layer, said semiconductor body also containing a diffused emitter layer extending into the body from the same plane surface, the emitter layer being of smaller lateral extent than the base layer and disposed within the base layer, defining an emitter junction extending to such plane surface and there surrounding the emitter layer, and a permanent, non-conducting coating entirely covering the collector and emitter junctions at the surface of the semiconductor body.

4. A transistor as defined in claim 3, comprising an ohmic emitter contact located inside the emitter junction on the plane surface of the semiconductor body, and an ohmic base contact located between the emitter junction and the collector junction on the same plane surface, the base contact being to one side of the emitter layer, and the collector junction being much closer to the emitter junction at the surface on the opposite side of the emitter layer than it is where the base contact lies between the two junctions.

5. A semiconductor device comprising a semiconductor body having a plane surface, a non-conducting coating on the plane surface of said body, said coating having a hole therein, said semiconductor body containing a diffused layer beneath the hole in said coating, defining a rectifying junction extending to the semiconductor surface under the edge of the hole in said coating, and a further non-conducting coating covering at least a portion of the semiconductor surface within the hole in the first-mentioned coating.

6. A double-diffused transistor comprising a semiconductor body having a plane surface, a non-conducting coating on the plane surface of said body, said coating having a hole therein, said semiconductor body containing a diffused base layer beneath the hole in said coating, defining a collector junction extending to the semiconductor surface under the edge of the hole in said coating, and a further non-conducting coating covering only a portion of the semiconductor surface within the hole in the first-mentioned coating, thereby defining a smaller hole, said semiconductor body containing a diffused emitter layer beneath said smaller hole, defining an emitter junction extending to the semiconductor surface under the edge of the smaller hole defined by said further coating.

References Cited in the file of this patent

UNITED STATES PATENTS

| | | |
|---|---|---|
| 2,713,132 | Matthews et al. | July 12, 1955 |
| 2,725,315 | Fuller | Nov. 29, 1955 |
| 2,748,325 | Jenny | May 29, 1956 |
| 2,759,133 | Mueller | Aug. 14, 1956 |
| 2,796,562 | Ellis et al. | June 18, 1957 |
| 2,798,189 | Alexander | July 2, 1957 |
| 2,886,748 | Barton | May 12, 1959 |
| 2,912,354 | Jung | Nov. 10, 1959 |
| 2,928,162 | Marinace | Mar. 15, 1960 |
| 2,937,960 | Pankove | May 24, 1960 |
| 2,964,689 | Buschert et al. | Dec. 13, 1960 |
| 2,976,426 | Reppaport | Mar. 21, 1961 |